(12) United States Patent
Kim

(10) Patent No.: US 9,148,057 B2
(45) Date of Patent: Sep. 29, 2015

(54) SEMICONDUCTOR APPARATUS

(71) Applicant: SK hynix Inc., Incheon-si, Gyeonggi-do (KR)

(72) Inventor: Chul Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/308,395

(22) Filed: Jun. 18, 2014

(65) Prior Publication Data

US 2014/0333271 A1    Nov. 13, 2014

Related U.S. Application Data

(63) Continuation-in-part of application No. 13/604,042, filed on Sep. 5, 2012.

(30) Foreign Application Priority Data

Dec. 23, 2011   (KR) .......................... 10-2011-0141218

(51) Int. Cl.
| | | |
|---|---|---|
| *H01L 35/00* | (2006.01) | |
| *H01L 37/00* | (2006.01) | |
| *H03K 3/42* | (2006.01) | |
| *H03K 17/78* | (2006.01) | |
| *H02M 3/158* | (2006.01) | |

(52) U.S. Cl.
CPC .................................... *H02M 3/158* (2013.01)

(58) Field of Classification Search
CPC ......... G01K 7/01; G01K 3/005; G01K 7/015; G05F 3/30; H01L 23/34

USPC .................................. 327/512, 513; 374/178
See application file for complete search history.

(56) References Cited

U.S. PATENT DOCUMENTS

| | | | | |
|---|---|---|---|---|
| 7,891,865 | B2* | 2/2011 | Clark et al. | 374/110 |
| 2006/0195289 | A1* | 8/2006 | Choi et al. | 702/130 |
| 2008/0061761 | A1* | 3/2008 | Kim | 323/316 |
| 2011/0169552 | A1* | 7/2011 | Jeong | 327/512 |
| 2011/0279168 | A1* | 11/2011 | Lee et al. | 327/512 |
| 2012/0105132 | A1* | 5/2012 | Sugiura et al. | 327/512 |

* cited by examiner

*Primary Examiner* — Quan Tra
(74) *Attorney, Agent, or Firm* — William Park & Associates Ltd.

(57) ABSTRACT

A semiconductor apparatus includes a first structural body including a first temperature voltage generation unit configured to generate first and second temperature voltages which have different voltage level variations according to a temperature variation, in response to a temperature measurement command, and a first temperature information determination unit configured to generate first temperature information depending on a difference between levels of the first and second temperature voltages; and a second structural body including a second temperature voltage generation unit configured to generate a third temperature voltage and a fourth temperature voltage which have different voltage level variations according to a temperature variation, when a predetermined time elapses after the first and second temperature voltages are generated from the first structural body, and a second temperature information determination unit configured to generate second temperature information depending on a difference between levels of the third and fourth temperature voltages.

13 Claims, 5 Drawing Sheets

SEMICONDUCTOR APPARATUS

CROSS-REFERENCES TO RELATED APPLICATION

The application is a continuation-in-part of application Ser. No. 13/604,042, filed Sep. 5, 2012, titled "SEMICONDUCTOR APPARATUS", which is incorporated herein by reference in its entirety.

BACKGROUND

1. Technical Field

The present invention relates generally to a semiconductor apparatus, and more particularly to a circuit for generating information of temperature in a semiconductor apparatus with a stacked structure.

2. Related Art

A semiconductor apparatus constituted by transistors is substantially influenced by a temperature. Therefore, a semiconductor apparatus is configured to control an operation thereof (for example, a refresh operation in the case of a memory) by measuring a temperature inside the semiconductor apparatus.

In order to acquire precise temperature information, a semiconductor apparatus includes a temperature information generation circuit therein.

In a semiconductor memory apparatus, a plurality of memory chips are stacked to increase memory capacity. In such a semiconductor memory apparatus, since temperatures are different in respective layers (e.g., memory chips), operation characteristics thereof may be different from each other. Thus, precise temperature information of the respective layers (e.g., memory chips) is necessary.

Since characteristics of a transistor may vary according to the temperature change, a semiconductor apparatus constituted by transistors need the information about the temperatures inside the semiconductor apparatus so as to control an operation of the semiconductor apparatus and thus reduce the occurrence of an operation error.

SUMMARY

In an embodiment of the present invention, a semiconductor apparatus includes: a first structural body including a first temperature voltage generation unit configured to generate a first temperature voltage and a second temperature voltage which have different voltage level variations according to a temperature variation, in response to a temperature measurement command, and a first temperature information determination unit configured to generate first temperature information in response a difference between levels of the first and second temperature voltages; and a second structural body including a second temperature voltage generation unit configured to generate a third temperature voltage and a fourth temperature voltage which have different voltage level variations according to a temperature variation, when a predetermined time elapses after the first and second temperature voltages are generated from the first structural body, and a second temperature information determination unit configured to generate second temperature information in response a difference between levels of the third and fourth temperature voltages.

In an embodiment of the present invention, a semiconductor apparatus having first and second structural bodies which are stacked and a through via which electrically connects the first and second structural bodies includes: the first structural body configured to generate a first temperature voltage and a second temperature voltage which have different voltage level variations according to a temperature variation, when a temperature measurement command is inputted; and the second structural body configured to generate a third temperature voltage and a fourth temperature voltage which have different voltage level variations according to a temperature variation, when a predetermined time elapses after the first temperature voltage and the second temperature voltage are generated, wherein the first structural body generates temperature information in response to a difference between levels of the first and second temperature voltages, and generates temperature information in response to a difference between levels of the third and fourth temperature voltages transferred through the through via.

In an embodiment of the present invention, a semiconductor apparatus includes: a first temperature voltage generation unit configured to generate an output control pulse in response to a temperature measurement command, and output a first temperature voltage and a second temperature voltage which have different voltage level variations according to a temperature variation, in response to the output control pulse; a first temperature information determination unit configured to generate first temperature information according to a difference between levels of the first and second temperature voltages; a second temperature voltage generation unit configured to output a third temperature voltage and a fourth temperature voltage which have different voltage level variations according to a temperature variation, in response to a delayed output control pulse which is acquired by delaying the output control pulse; and a second temperature information determination unit configured to generate second temperature information according to a difference between levels of the third and fourth temperature voltages.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present invention will be described below with reference to the accompanying drawings through exemplary embodiments.

Figure 1:
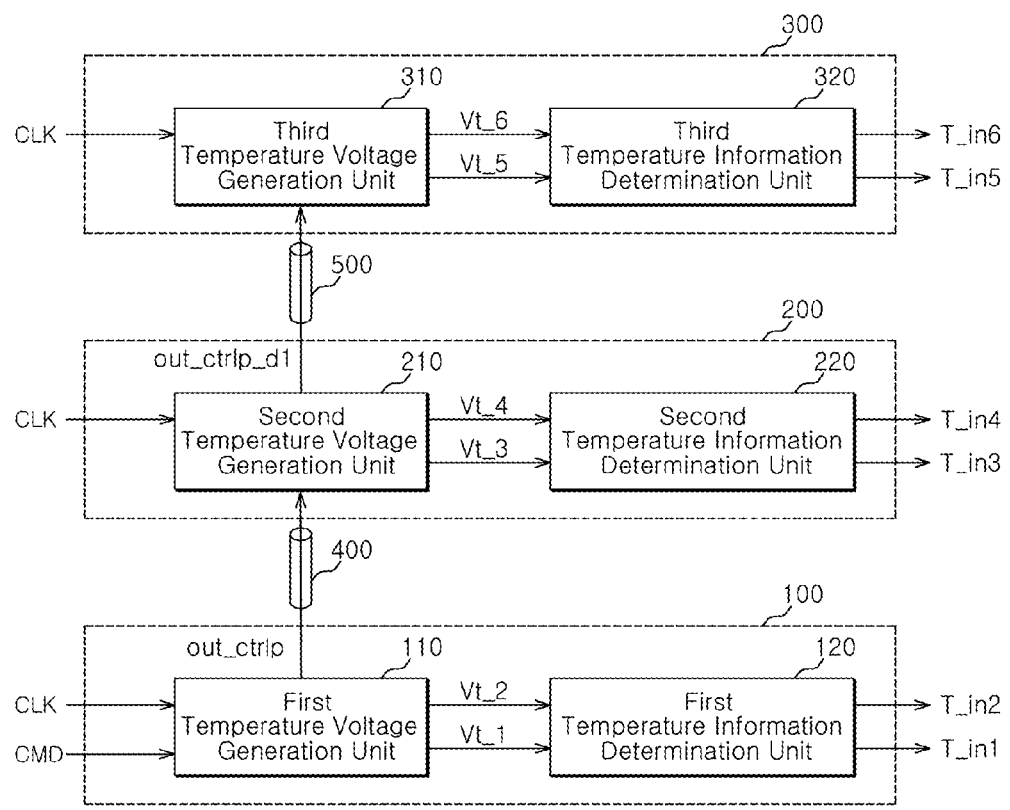
FIG. 1 is a configuration diagram of a semiconductor apparatus in accordance with an embodiment of the present invention.

Referring to FIG. 1, a semiconductor apparatus in accordance with an embodiment of the present invention includes first to third structural bodies 100, 200 and 300. The first to third structural bodies 100 to 300 are stacked and electrically connected with one another by through vias 400 and 500. Such a technology of forming through vias by defining holes through structural bodies such as semiconductor memory chips is a three-dimensional stack package technology for electrically connecting a plurality of stacked chips. For example, the three-dimensional stack package technology includes a through-silicon via technology. Each of the first to third structural bodies 100, 200 and 300 includes an integrated circuit constituted by transistors. If the semiconductor apparatus is a master/slave multi-chip package, the first structural body 100 may be a master chip and the second and third structural bodies 200 and 300 may be slave chips.

The first structural body 100 includes a first temperature voltage generation unit 110 and a first temperature information determination unit 120.

The first temperature voltage generation unit 110 is configured to generate a first temperature voltage Vt_1 and a second temperature voltage Vt_2 which have different voltage level variations according to a temperature variation, in response to a temperature measurement command CMD. For example, the first temperature voltage generation unit 110 generates an output control pulse out_ctrlp in response to the temperature measurement command CMD, and outputs the first and second temperature voltages Vt_1 and Vt_2 during the activation period of the output control pulse out_ctrlp.

The first temperature information determination unit 120 is configured to generate first temperature information T_in1 and T_in2 according to a difference between the levels of the first and second temperature voltages Vt_1 and Vt_2. The first temperature information T_in1 and T_in2 includes a first temperature information signal T_in1 and a second temperature information signal T_in2.

The second structural body 200 includes a second temperature voltage generation unit 210 and a second temperature information determination unit 220.

The second temperature voltage generation unit 210 is configured to generate a third temperature voltage Vt_3 and a fourth temperature voltage Vt_4 which have different voltage level variations according to a temperature variation, when a predetermined time elapses after the first and second temperature voltages Vt_1 and Vt_2 are generated. For example, the second temperature voltage generation unit 210 generates the output control pulse out_ctrlp of the first structural body 100 inputted through the through via 400, as a first delayed output control pulse out_ctrlp_d1 in synchronization with a clock CLK. Also, the second temperature voltage generation unit 210 outputs the third and fourth temperature voltages Vt_3 and Vt_4 during the activation period of the first delayed output control pulse out_ctrlp_d1.

The second temperature information determination unit 220 is configured to generate second temperature information T_in3 and T_in4 depending on a difference between the levels of the third and fourth temperature voltages Vt_3 and Vt_4. The second temperature information T_in3 and T_in4 includes a third temperature information signal T_in3 and a fourth temperature information signal T_in4.

The third structural body 300 includes a third temperature voltage generation unit 310 and a third temperature information determination unit 320.

The third temperature voltage generation unit 310 is configured to generate a fifth temperature voltage Vt_5 and a sixth temperature voltage Vt_6 which have different voltage level variations according to a temperature variation, when a predetermined time elapses after the third and fourth temperature voltages Vt_3 and Vt_4 are generated. For example, the third temperature voltage generation unit 310 generates the first delayed output control pulse out_ctrlp_d1 of the second structural body 200 inputted through the through via 500, as a second delayed output control pulse out_ctrlp_d2 (not shown) in synchronization with the clock CLK. Also, the third temperature voltage generation unit 310 outputs the fifth and sixth temperature voltages Vt_5 and Vt_6 during the activation period of the second delayed output control pulse out_ctrlp_d2.

The third temperature information determination unit 320 is configured to generate third temperature information T_in5 and T_in6 depending on a difference between the levels of the fifth and sixth temperature voltages Vt_5 and Vt_6. The third temperature information T_in5 and T_in6 includes a fifth temperature information signal T_in5 and a sixth temperature information signal T_in6.

Unlike the second and third temperature voltage generation units 210 and 310, the first temperature voltage generation unit 110 generates a preliminary output control pulse out_ctrlp_pre when the temperature measurement command CMD is inputted, and transfers the output control pulse out_ctrlp generated by synchronizing the preliminary output control pulse out_ctrlp_pre with the clock CLK, to the second structural body 200 through the through via 400.

Figure 2:
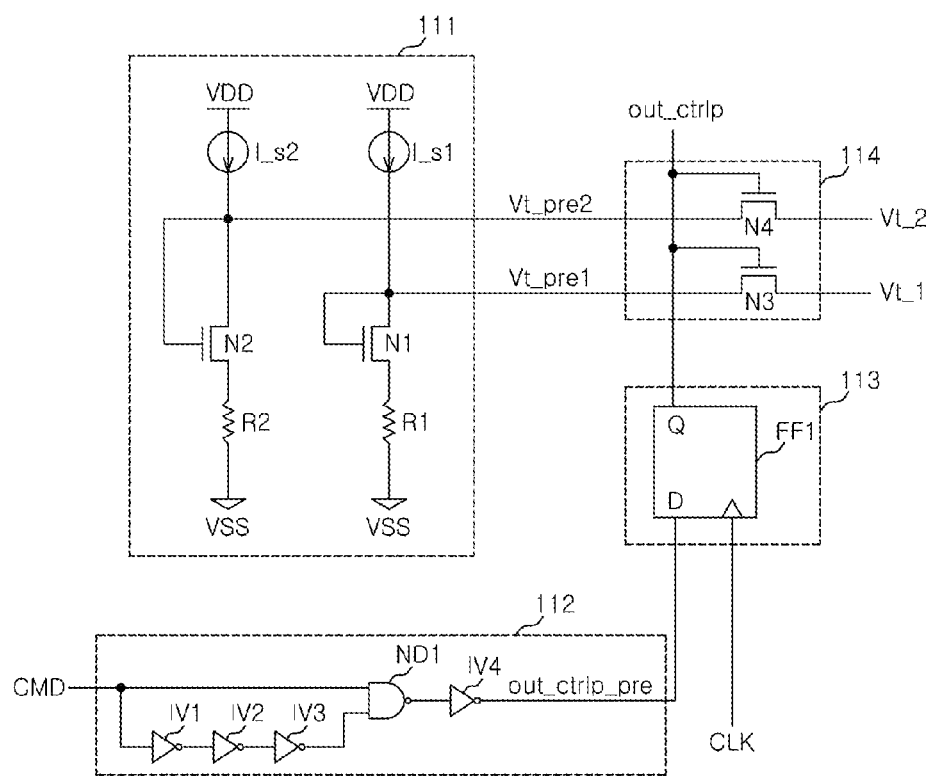
FIG. 2 is a configuration diagram of the first temperature voltage generating section shown in FIG. 1.

Referring to FIG. 2, the first temperature voltage generation unit 110 includes a first preliminary temperature voltage generating section 111, a pulse generating section 112, a first clock synchronizing section 113, and a first voltage output section 114.

The first preliminary temperature voltage generating section 111 is configured to generate a first preliminary temperature voltage Vt_pre1 and a second preliminary temperature voltage Vt_pre2 which have different voltage level variations according to a temperature variation. For example, the first preliminary temperature voltage Vt_pre1 may be a proportional-to-absolute temperature (PTAT) voltage of which level increases as a temperature rises. Further, the second preliminary temperature voltage Vt_pre2 may be a complementary-to-absolute temperature (CTAT) voltage of which level decreases as a temperature rises. The level variation range of the first preliminary temperature voltage Vt_pre1 may be larger or smaller than the level variation range of the second preliminary temperature voltage Vt_pre2 for the same temperature variation.

The first preliminary temperature voltage generating section 111 includes first and second transistors N1 and N2, first and second resistor elements R1 and R2 and first and second current source parts I_s1 and I_s2. The first transistor N1 is applied with current of the first current source part I_s1 through a node to which the gate and the drain of the first transistor N1 are coupled. The second transistor N2 is applied with current of the second current source part I_s2 through a node to which the gate and the drain of the second transistor N2 are coupled. The first resistor element R1 has one end to which the source of the first transistor N1 is coupled and the other end to which a ground terminal VSS is coupled. The second resistor element R2 has one end to which the source of the second transistor N2 is coupled and the other end to which the ground terminal VSS is coupled. The first and second current source parts I_s1 and I_s2 are applied with an external voltage VDD. The first preliminary temperature voltage Vt_pre1 is outputted from the node to which the gate and the drain of the first transistor N1 are coupled. The second preliminary temperature voltage Vt_pre2 is outputted from the node to which the gate and the drain of the second transistor N2 are coupled. By differentiating the threshold voltage or size of the first transistor N1 from those of the second transistor N2, through current may vary according to a temperature variation, and thus it is possible to generate the first and second preliminary temperature voltages Vt_pre1 and Vt_pre2 which have different voltage level variations according to a temperature variation. Each of the first and second transistors N1 and N2 may be an FET (field effect transistor) or a BJT (bipolar junction transistor).

The pulse generating section 112 is configured to generate the preliminary output control pulse out_ctrlp_pre in response to the temperature measurement command CMD.

The pulse generating section 112 includes first to fourth inverters IV1 to IV4 and a NAND gate ND1. The first inverter IV1 is inputted with the temperature measurement command CMD. The second inverter IV2 is inputted with the output of the first inverter IV1. The third inverter IV3 is inputted with the output of the second inverter IV2. The NAND gate ND1 is inputted with the temperature measurement command CMD and the output of the third inverter IV3. The fourth inverter IV4 is inputted with the output of the NAND gate ND1 and outputs it as the preliminary output control pulse out_ctrlp_pre.

The first clock synchronizing section 113 is configured to output the preliminary output control pulse out_ctrlp_pre as the output control pulse out_ctrlp in synchronization with the clock CLK.

The first clock synchronizing section 113 includes a first flip-flop FF1. The first flip-flop FF1 is inputted with the clock CLK and the preliminary output control pulse out_ctrlp_pre and outputs the output control pulse out_ctrlp.

The first voltage output section 114 is configured to output the first and second preliminary temperature voltages Vt_pre1 and Vt_pre2 as the first and second temperature voltages Vt_1 and Vt_2 during the activation period of the output control pulse out_ctrlp. For example, the first voltage output section 114 outputs the first and second preliminary temperature voltages Vt_pre1 and Vt_pre2 as the first and second temperature voltages Vt_1 and Vt_2 while the output control pulse out_ctrlp is activated to a high level.

The first voltage output section 114 includes third and fourth transistors N3 and N4. The third transistor N3 has a gate which is inputted with the output control pulse out_ctrlp, a drain which is inputted with the first preliminary temperature voltage Vt_pre1, and a source which outputs the first temperature voltage Vt_1. The fourth transistor N4 has a gate which is inputted with the output control pulse out_ctrlp, a drain which is inputted with the second preliminary temperature voltage Vt_pre2, and a source which outputs the second temperature voltage Vt_2.

Figure 3:
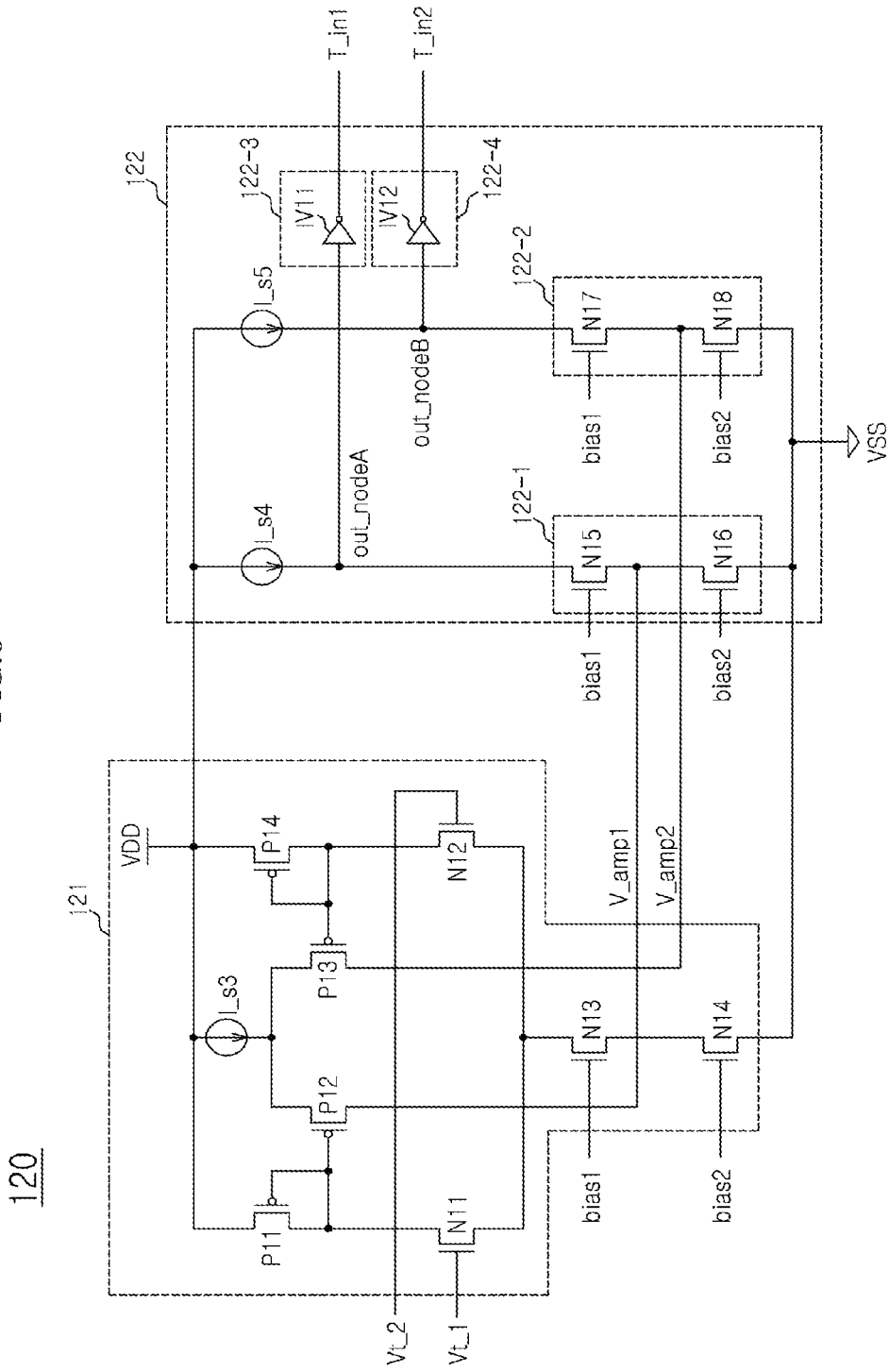
FIG. 3 is a configuration diagram of the first temperature information determining section shown in FIG. 1.

Referring to FIG. 3, the first temperature information determination unit 120 includes an amplifying section 121 and a temperature information output section 122.

The amplifying section 121 is configured to amplify the levels of the first and second temperature voltages Vt_1 and Vt_2 and generate a first amplified voltage V_amp1 and a second amplified voltage V_amp2. For example, the amplifying section 121 amplifies the voltage levels of the first and second temperature voltages Vt_1 and Vt_2 and makes the difference between the voltage levels of the first and second amplified voltages V_amp1 and V_amp2 larger than the difference between the voltage levels of the first and second temperature voltages Vt_1 and Vt_2.

The amplifying section 121 includes fifth to twelfth transistors N11 to N14 and P11 to P14, and a third current source part I_s3. The fifth transistor N11 has a gate which is inputted with the first temperature voltage Vt_1. The sixth transistor N12 has a gate which is inputted with the second temperature voltage Vt_2. The seventh transistor N13 has a drain to which a node coupled with the sources of the fifth and sixth transistors N11 and N12 is coupled, and a gate which is applied with a first bias voltage bias'. The eighth transistor N14 has a gate which is applied with a second bias voltage bias2, a drain to which the source of the seventh transistor N13 is coupled, and a source to which the ground terminal VSS is coupled. The ninth transistor P11 has a source which is applied with the external voltage VDD, and a gate and a drain which are coupled to a node to which the drain of the fifth transistor N11 is coupled. The tenth transistor P12 has a gate to which a node coupled with the gate and the drain of the ninth transistor P11 is coupled, a source which is inputted with the current of the third current source part I_s3, and a drain which outputs the first amplified voltage V_amp1. The eleventh transistor P13 has a gate to which the drain of the sixth transistor N12 is coupled, a source which is inputted with the current of the third current source part I_s3, and a drain which outputs the second amplified voltage V_amp2. The twelfth transistor P14 has a gate and a drain which are coupled to a node to which the drain of the sixth transistor N12 is coupled, and a source which is applied with the external voltage VDD. The first current source part I_s1 is applied with the external voltage VDD and supplies current to a node to which the sources of the tenth and eleventh transistors P12 and P13 are coupled. The third current source part I_s3 is applied with the external voltage VDD.

The temperature information output section 122 includes fourth and fifth current source parts I_s4 and I_s5, first and second current sink parts 122-1 and 122-2, and first and second signal output parts 122-3 and 122-4.

The fourth current source part I_s4 is configured to be applied with the external voltage VDD and supply current to a first output node out_nodeA.

The fifth current source part I_s5 is configured to be applied with the external voltage VDD and supply current to a second output node out_nodeB.

The first current sink part 122-1 is configured to control an amount of current flowing from the first output node out_nodeA to the ground terminal VSS depending on the level of the first amplified voltage V_amp1. The first current sink part 122-1 includes thirteenth and fourteenth transistors N15 and N16. The thirteenth transistor N15 has a gate which is applied with the first bias voltage bias1, and a drain to which the first output node out_nodeA is coupled. The fourteenth transistor N16 has a gate which is applied with the second bias voltage bias2, a drain to which the source of the thirteenth transistor N15 is coupled, and a source to which the ground terminal VSS is coupled. The first amplified voltage V_amp1 is applied to a node to which the source of the thirteenth transistor N15 and the drain of the fourteenth transistor N16 are coupled.

The second current sink part 122-2 is configured to control an amount of current flowing from the second output node out_nodeB to the ground terminal VSS depending on the level of the second amplified voltage V_amp2. The second current sink part 122-2 includes fifteenth and sixteenth transistors N17 and N18. The fifteenth transistor N17 has a gate which is applied with the first bias voltage bias1, and a drain to which the second output node out_nodeB is coupled. The sixteenth transistor N18 has a gate which is applied with the second bias voltage bias2, a drain to which the source of the fifteenth transistor N17 is coupled, and a source to which the ground terminal VSS is coupled. The second amplified voltage V_amp2 is applied to a node to which the source of the fifteenth transistor N17 and the drain of the sixteenth transistor N18 are coupled.

The first signal output part 122-3 is configured to determine the level of the first temperature information signal T_in1 depending on the voltage level of the first output node out_nodeA.

The first signal output part 122-3 includes a fifth inverter IV11. The fifth inverter IV11 has an input terminal to which the first output node out_nodeA is coupled and an output terminal from which the first temperature information signal T_in1 is outputted. The fifth inverter IV11 outputs the first temperature information signal T_in1 of a low level when the voltage level of the first output node out_nodeA is equal to or higher than a preset voltage level, and outputs the first temperature information signal T_in1 of a high level when the voltage level of the first output node out_nodeA is equal to or lower than the preset voltage level.

The second signal output part 122-4 is configured to determine the level of the second temperature information signal T_in2 depending on the voltage level of the second output node out_nodeB.

The second signal output part 122-4 includes a sixth inverter IV12. The sixth inverter IV12 has an input terminal to which the second output node out_nodeB is coupled and an output terminal from which the second temperature information signal T_in2 is outputted. The sixth inverter IV12 outputs the second temperature information signal T_in2 of a low level when the voltage level of the second output node out_nodeB is equal to or higher than a preset voltage level, and outputs the second temperature information signal T_in2 of a high level when the voltage level of the second output node out_nodeB is equal to or lower than the preset voltage level. The preset voltage level of the fifth inverter IV11 and the preset voltage level of the sixth inverter IV12 may be the same with or different from each other.

Figure 4:
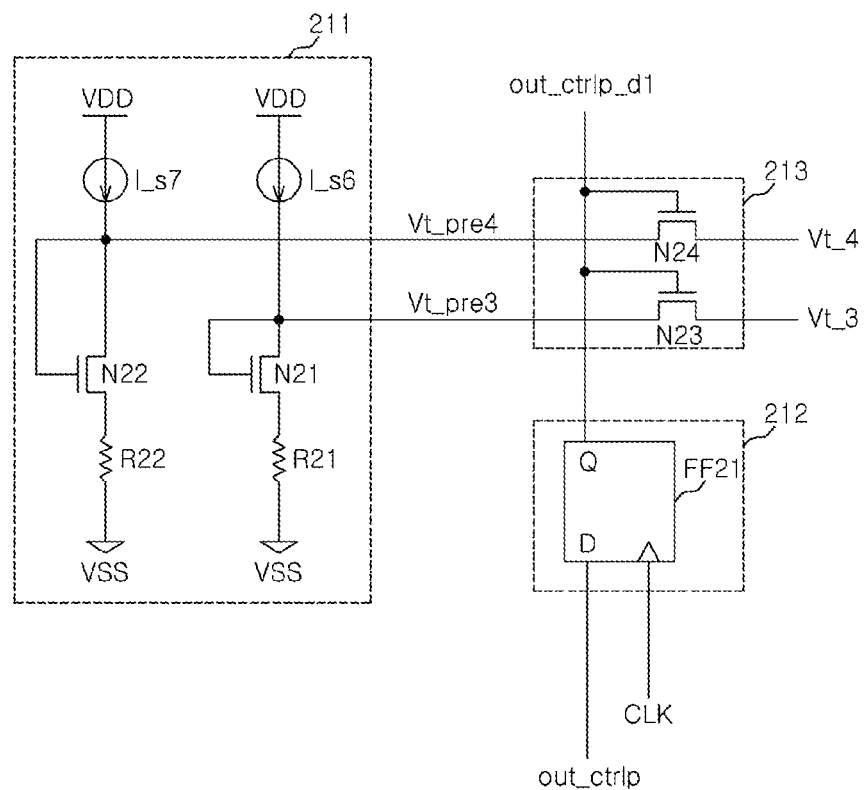
FIG. 4 is a configuration diagram of the second temperature voltage generating section shown in FIG. 1.

Referring to FIG. 4, the second temperature voltage generation unit 210 includes a second preliminary temperature voltage generating section 211, a second clock synchronizing section 212, and a second voltage output section 213.

The second preliminary temperature voltage generating section 211 is configured to generate a third preliminary temperature voltage Vt_pre3 and a fourth preliminary temperature voltage Vt_pre4 which have different voltage level variations according to a temperature variation. For example, the third preliminary temperature voltage Vt_pre3 may be a proportional-to-absolute temperature (PTAT) voltage of which level increases as a temperature rises. Further, the fourth preliminary temperature voltage Vt_pre4 may be a complementary-to-absolute temperature (CTAT) voltage of which level decreases as a temperature rises. The level variation range of the third preliminary temperature voltage Vt_pre3 may be larger or smaller than the level variation range of the fourth preliminary temperature voltage Vt_pre4 for the same temperature variation.

The second preliminary temperature voltage generating section 211 includes seventeenth and eighteenth transistors N21 and N22, third and fourth resistor elements R21 and R22 and sixth and seventh current source parts I_s6 and I_s7. The seventeenth transistor N21 is applied with current of the sixth current source part I_s6 through a node to which the gate and the drain of the seventeenth transistor N21 are coupled. The eighteenth transistor N22 is applied with current of seventh current source part I_s7 through a node to which the gate and the drain of the eighteenth transistor N22 are coupled. The third resistor element R21 has one end to which the source of the seventeenth transistor N21 is coupled and the other end to which the ground terminal VSS is coupled. The fourth resistor element R22 has one end to which the source of the eighteenth transistor N22 is coupled and the other end to which the ground terminal VSS is coupled. The third preliminary temperature voltage Vt_pre3 is outputted from the node to which the gate and the drain of the seventeenth transistor N21 are coupled. The fourth preliminary temperature voltage Vt_pre4 is outputted from the node to which the gate and the drain of the eighteenth transistor N22 are coupled. By differentiating the threshold voltage or size of the seventeenth transistor N21 from those of the eighteenth transistor N22, through current may vary according to a temperature variation, and thus it is possible to generate the third and fourth preliminary temperature voltages Vt_pre3 and Vt_pre4 which have different voltage level variations according to a temperature variation. Each of the seventeenth and eighteenth transistors N21 and N22 may be an FET (field effect transistor) or a BJT (bipolar junction transistor). The sixth and seventh current source parts I_s6, I_s7 are applied with the external voltage VDD.

The second clock synchronizing section 212 is configured to output the output control pulse out_ctrlp transferred through the through via 400 from the first structural body 100, as the first delayed output control pulse out_ctrlp_d1 in synchronization with the clock CLK.

The second clock synchronizing section 212 includes a second flip-flop FF21. The second flip-flop FF21 is inputted with the clock CLK and the output control pulse out_ctrlp and outputs the first delayed output control pulse out_ctrlp_d1.

The second voltage output section 213 is configured to output the third and fourth preliminary temperature voltages Vt_pre3 and Vt_pre4 as the third and fourth temperature voltages Vt_3 and Vt_4 during the activation period of the first delayed output control pulse out_ctrlp_d1. For example, the second voltage output section 213 outputs the third and fourth preliminary temperature voltages Vt_pre3 and Vt_pre4 as the third and fourth temperature voltages Vt_3 and Vt_4 while the first delayed output control pulse out_ctrlp_d1 is activated to a high level.

The second voltage output section 213 includes nineteenth and twentieth transistors N23 and N24. The nineteenth transistor N23 has a gate which is inputted with the first delayed output control pulse out_ctrlp_d1, a drain which is inputted with the third preliminary temperature voltage Vt_pre3, and a source which outputs the third temperature voltage Vt_3. The twentieth transistor N24 has a gate which is inputted with the first delayed output control pulse out_ctrlp_d1, a drain which is inputted with the fourth preliminary temperature voltage Vt_pre4, and a source which outputs the fourth temperature voltage Vt_4.

The second temperature information determination unit 220 is configured to generate the second temperature information T_in3 and T_in4 depending on the difference between the levels of the third and fourth temperature voltages Vt_3 and Vt_4. The second temperature information T_in3 and T_in4 includes the third temperature information signal T_in3 and the fourth temperature information signal T_in4. The second temperature information determination unit 220 may have the same configuration as the first temperature information determination unit 120 shown in FIG. 1 except that input signals and output signals thereof are different.

The third temperature voltage generation unit 310 is configured to generate a fifth preliminary temperature voltage Vt_pre5 (not shown) and a sixth preliminary temperature voltage Vt_pre6 (not shown) which have different voltage level variations according to a temperature variation. For example, the fifth preliminary temperature voltage Vt_pre5 may be a proportional-to-absolute temperature (PTAT) voltage of which level increases as a temperature rises. Further, the sixth preliminary temperature voltage Vt_pre6 may be a complementary-to-absolute temperature (CTAT) voltage of which level decreases as a temperature rises. The level variation range of the fifth preliminary temperature voltage Vt_pre5 may be larger or smaller than the level variation range of the sixth preliminary temperature voltage Vt_pre6 for the same temperature variation. The third temperature voltage generation unit 310 may have the same configuration as the second temperature voltage generation unit 210 shown in FIG. 1 except that input signals and output signals thereof are different.

The third temperature information determination unit 320 is configured to generate the third temperature information T_in5 and T_in6 depending on the difference between the levels of the fifth and sixth temperature voltages Vt_5 and Vt_6. The third temperature information T_in5 and T_in6 includes the fifth temperature information signal T_in5 and the sixth temperature information signal T_in6. The third temperature information determination unit 320 may have the same configuration as the first temperature information determination unit 120 shown in FIG. 1 except that input signals and output signals thereof are different.

The semiconductor apparatus in accordance with an embodiment of the present invention, configured as mentioned above, operates as follows.

As shown in FIG. 1, an embodiment of the present invention will be explained by exemplifying the semiconductor apparatus in which the first to third structural bodies 100, 200 and 300 are stacked.

The temperature measurement command CMD is inputted to the first structural body 100.

The first temperature voltage generation unit 110 of the first structural body 100 generates the preliminary output control pulse out_ctrlp_pre when the temperature measurement command CMD is inputted, and outputs the preliminary output control pulse out_ctrlp_pre as the output control pulse out_ctrlp in synchronization with the clock CLK.

While the first temperature voltage generation unit 110 generates the first and second preliminary temperature voltages Vt_pre1 and Vt_pre2 which have different voltage level variations according to a temperature variation, it outputs the first and second preliminary temperature voltages Vt_pre1 and Vt_pre2 as the first and second temperature voltages Vt_1 and Vt_2 during the activation period of the output control pulse out_ctrlp.

The first temperature information determination unit 120 is inputted with the first and second temperature voltages Vt_1 and Vt_2 from the first temperature voltage generation unit 110, and outputs the difference between the levels of the first and second temperature voltages Vt_1 and Vt_2 as the first temperature information T_in1 and T_in2.

The output control pulse out_ctrlp generated by the first temperature voltage generation unit 110 of the first structural body 100 is transferred to the second structural body 200 through the through via 400.

The second temperature voltage generation unit 210 of the second structural body 200, which is inputted with the output control pulse out_ctrlp from the first structural body 100, generates the output control pulse out_ctrlp as the first delayed output control pulse out_ctrlp_d1 in synchronization with the clock CLK. Since the first delayed output control pulse out_ctrlp_d1 is generated by synchronizing the output control pulse out_ctrlp delayed by the delay times of elements with the clock CLK, the first delayed output control pulse out_ctrlp_d1 is a signal which is acquired by delaying the output control pulse out_ctrlp by one cycle of the clock CLK.

While the second temperature voltage generation unit 210 generates the third and fourth preliminary temperature voltages Vt_pre3 and Vt_pre4 which have different voltage level variations according to a temperature variation, it outputs the third and fourth preliminary temperature voltages Vt_pre3 and Vt_pre4 as the third and fourth temperature voltages Vt_3 and Vt_4 during the activation period of the first delayed output control pulse out_ctrlp_d1.

The second temperature information determination unit 220 is inputted with the third and fourth temperature voltages Vt_3 and Vt_4 from the second temperature voltage generation unit 210, and outputs the difference between the levels of the third and fourth temperature voltages Vt_3 and Vt_4 as the second temperature information T_in3 and T_in4.

As a result, the second temperature information determination unit 220 outputs the second temperature information T_in3 and T_in4 after one cycle of the clock CLK when compared to the first temperature information T_in1 and T_in2 of the first temperature information determination unit 120.

The first delayed output control pulse out_ctrlp_d1 generated by the second temperature voltage generation unit 210 of the second structural body 200 is transferred to the third structural body 300 through the through via 500.

The third temperature voltage generation unit 310 of the third structural body 300, which is inputted with the first delayed output control pulse out_ctrlp_d1 from the second structural body 200, generates the first delayed output control pulse out_ctrlp_d1 as the second delayed output control pulse out_ctrlp_d2 in synchronization with the clock CLK. Since the second delayed output control pulse out_ctrlp_d2 is generated by synchronizing the first delayed output control pulse out_ctrlp_d1 delayed by the delay times of elements with the clock CLK, the second delayed output control pulse out_ctrlp_d2 is a signal which is acquired by delaying the first delayed output control pulse out_ctrlp_d1 by one cycle of the clock CLK.

While the third temperature voltage generation unit 310 generates the fifth and sixth preliminary temperature voltages Vt_pre5 and Vt_pre6 which have different voltage level variations according to a temperature variation, it outputs the fifth and sixth preliminary temperature voltages Vt_pre5 and Vt_pre6 as the fifth and sixth temperature voltages Vt_5 and Vt_6 during the activation period of the second delayed output control pulse out_ctrlp_d2.

The third temperature information determination unit 320 is inputted with the fifth and sixth temperature voltages Vt_5 and Vt_6 from the third temperature voltage generation unit 310, and outputs the third temperature information T_in5 and T_in6 corresponding to the difference between the levels of the fifth and sixth temperature voltages Vt_5 and Vt_6.

As a result, the third temperature information determination unit 320 outputs the third temperature information T_in5 and T_in6 after one cycle of the clock CLK when compared to the second temperature information T_in3 and T_in4 of the second temperature information determination unit 220.

As is apparent from the above descriptions, in the semiconductor apparatus having the plurality of stacked structural bodies in accordance with an embodiment of the present invention, temperature information for the respective structural bodies can be acquired by one temperature measurement command. Here, the temperature information for the respective structural bodies can be consecutively acquired.

Figure 5:
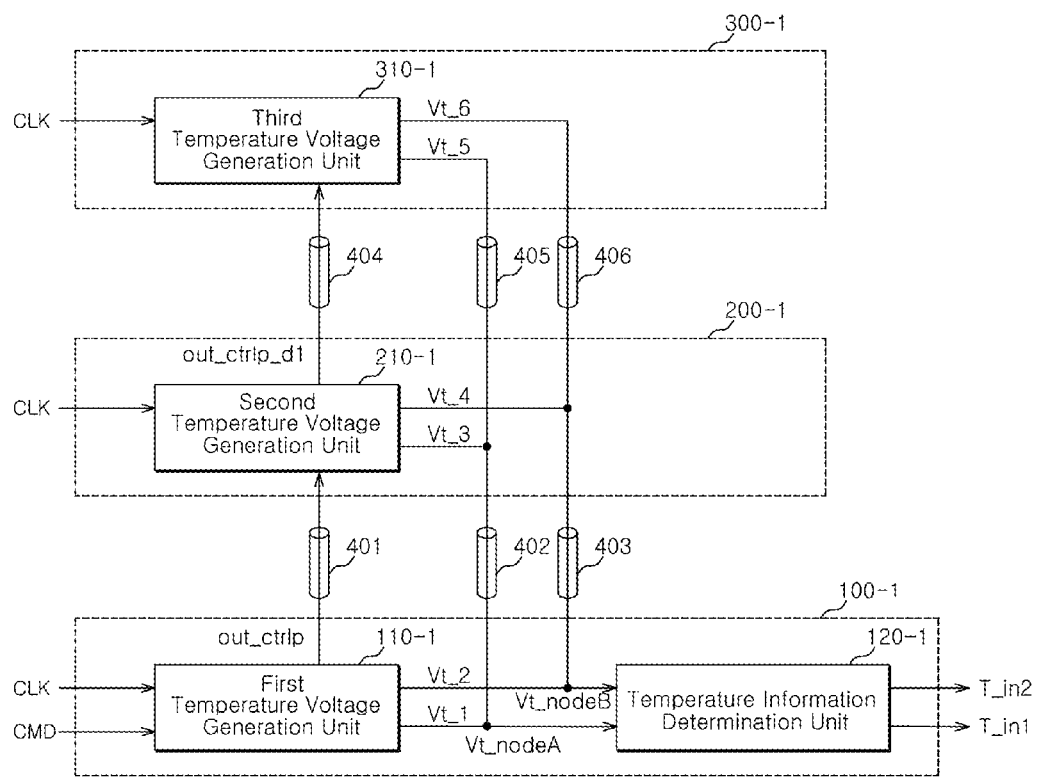
FIG. 5 is a configuration diagram of a semiconductor apparatus in accordance with an embodiment of the present invention.

Referring to FIG. 5, a semiconductor apparatus in accordance with an embodiment of the present invention includes first to third structural bodies 100-1, 200-1 and 300-1, and through vias 401 to 406. The first to third structural bodies 100-1, 200-1 and 300-1 have a stacked shape, and the through vias 401 to 406 electrically connect the first to third structural bodies 100-1, 200-1 and 300-1 with one another. Such a technology of forming through vias by defining holes through structural bodies, for example, semiconductor chips, is a three-dimensional stack package technology for electrically connecting a plurality of stacked chips. For example, the three-dimensional stack package technology includes a through-silicon via technology. Each of the first to third structural bodies 100-1, 200-1 and 300-1 includes an integrated circuit constituted by transistors. If the semiconductor apparatus is a master/slave multi-chip package, the first structural body 100-1 may be a master chip and the second and third structural bodies 200-1 and 300-1 may be slave chips.

The first structural body 100-1 includes a first temperature voltage generation unit 110-1 and a temperature information determination unit 120-1. The first temperature voltage generation unit 110-1 is configured to generate a first temperature voltage Vt_1 and a second temperature voltage Vt_2 which have different voltage level variations according to a temperature variation, when a temperature measurement command CMD is inputted. The first temperature voltage generation unit 110-1 generates an output control pulse out_ctrlp in response to the temperature measurement command CMD, and the first and second temperature voltages Vt_1 and Vt_2 are outputted during the activation period of the output control pulse out_ctrlp. The output control pulse out_ctrlp is inputted to the second structural body 200-1 through the through via 401.

The second structural body 200-1 includes a second temperature voltage generation unit 210-1. The second temperature voltage generation unit 210-1 is configured to generate a third temperature voltage Vt_3 and a fourth temperature voltage Vt_4 which have different voltage level variations according to a temperature variation, when a predetermined time elapses after the first and second temperature voltages Vt_1 and Vt_2 are generated. For example, the second temperature voltage generation unit 210-1 generates a first delayed output control pulse out_ctrlp_d1 by delaying the output control pulse out_ctrlp of the first temperature voltage generation unit 110-1 by one cycle of a clock CLK. The second temperature voltage generation unit 210-1 outputs the third and fourth temperature voltages Vt_3 and Vt_4 during the activation period of the first delayed output control pulse out_ctrlp_d1. The first delayed output control pulse out_ctrlp_d1 is transferred to the third structural body 300-1 through the through via 404.

The third structural body 300-1 includes a third temperature voltage generation unit 310-1. The third temperature voltage generation unit 310-1 is configured to generate a fifth temperature voltage Vt_5 and a sixth temperature voltage Vt_6 which have different voltage level variations according to a temperature variation, when a predetermined time elapses after the third and fourth temperature voltages Vt_3 and Vt_4 are generated. For example, the third temperature voltage generation unit 310-1 generates a second delayed output control pulse out_ctrlp_d2 (not shown) by delaying the first delayed output control pulse out_ctrlp_d1 of the second temperature voltage generation unit 210-1 by one cycle of the clock CLK. The third temperature voltage generation unit 310-1 outputs the fifth and sixth temperature voltages Vt_5 and Vt_6 during the activation period of the second delayed output control pulse out_ctrlp_d2.

The temperature information determination unit 120-1 included in the first structural body 100-1 is configured to generate temperature information T_in1 and T_in2 depending on a difference between the voltage levels of a first temperature voltage node Vt_nodeA and a second temperature voltage node Vt_nodeB. The first and second temperature voltage nodes Vt_nodeA and Vt_nodeB are nodes to which the output terminals of the first to third temperature voltage generation units 110-1, 210-1 and 310-1 and the input terminal of the temperature information determination unit 120-1 are commonly coupled. Accordingly, the first and second temperature voltages Vt_1 and Vt_2 of the first temperature voltage generation unit 110-1 are transferred to the temperature information determination unit 120-1 through the first and second temperature voltage nodes Vt_nodeA and Vt_nodeB. The third and fourth temperature voltages Vt_3 and Vt_4 of the second temperature voltage generation unit 210-1 are transferred to the temperature information determination unit 120-1 through the through vias 402 and 403 and the first and second temperature voltage nodes Vt_nodeA and Vt_nodeB. Further, the fifth and sixth temperature voltages Vt_5 and Vt_6 of the third temperature voltage generation unit 310-1 are transferred to the temperature information determination unit 120-1 through the through vias 405 and 406, the second structural body 200-1, the through vias 402 and 403 and the first and second temperature voltage nodes Vt_nodeA and Vt_nodeB.

The first temperature voltage generation unit 110-1 may be configured in the same way as the first temperature voltage generation unit 110 shown in FIGS. 1 and 2.

The first temperature information determination unit 120-1 may be configured in the same way as the first temperature information determination unit 120 shown in FIGS. 1 and 3.

The second and third temperature voltage generation units 210-1 and 310-1 may be configured in the same way as the second temperature voltage generation unit 210 shown in FIGS. 1 and 4.

The semiconductor apparatus in accordance with an embodiment of the present invention, configured as mentioned above, operates as follows.

The temperature measurement command CMD is inputted.

The first temperature voltage generation unit 110-1 generates the output control pulse out_ctrlp when the temperature measurement command CMD is inputted.

The first temperature voltage generation unit 110-1 generates the first and second temperature voltages Vt_1 and Vt_2 and outputs the first and second temperature voltages Vt_1 and Vt_2 to the temperature information determination unit 120-1 during the activation period of the output control pulse out_ctrlp.

The temperature information determination unit 120-1 generates the temperature information T_in1 and T_in2 according to a difference between the levels of the first and second temperature voltages Vt_1 and Vt_2.

The output control pulse out_ctrlp is transferred to the second temperature voltage generation unit 210-1 of the second structural body 200-1 through the through via 401.

The second temperature voltage generation unit 210-1 generates the first delayed output control pulse out_ctrlp_d1 by delaying the output control pulse out_ctrlp.

The second temperature voltage generation unit 210-1 generates the third and fourth temperature voltages Vt_3 and Vt_4, and outputs the third and fourth temperature voltages Vt_3 and Vt_4 during the activation period of the first delayed output control pulse out_ctrlp_d1. The third and fourth temperature voltages Vt_3 and Vt_4 are transferred to the temperature information determination unit 120-1 of the first structural body 100-1 through the through vias 402 and 403. The temperature information determination unit 120-1 generates the temperature information T_in1 and T_in2 according to a difference between the levels of the third and fourth temperature voltages Vt_3 and Vt_4.

The first delayed output control pulse out_ctrlp_d1 is transferred to the third temperature voltage generation unit 310-1 of the third structural body 300-1 through the through via 404.

The third temperature voltage generation unit 310-1 generates the second delayed output control pulse out_ctrlp_d2 by delaying the first delayed output control pulse out_ctrlp_d1.

The third temperature voltage generation unit 310-1 generates the fifth and sixth temperature voltages Vt_5 and Vt_6, and outputs the fifth and sixth temperature voltages Vt_5 and Vt_6 during the activation period of the second delayed output control pulse out_ctrlp_d2. The fifth and sixth temperature voltages Vt_5 and Vt_6 are transferred to the temperature information determination unit 120-1 of the first structural body 100-1 through the through vias 405, 406, 402 and 403. The temperature information determination unit 120-1 generates the temperature information T_in1 and T_in2 according to a difference between the levels of the fifth and sixth temperature voltages Vt_5 and Vt_6.

As is apparent from the above descriptions, in the semiconductor apparatus in accordance with an embodiment of the present invention, when a temperature measurement command is inputted, voltages according to temperatures in respective layers (e.g., structural bodies) of the semiconductor apparatus are inputted to one temperature information determination unit with predetermined time intervals. Accordingly, since temperature information determination units for generating temperature information depending on voltage differences according to the temperatures of the respective structural bodies are not included in the respective structural bodies, areal efficiencies of the respective structural bodies may be improved. Also, as the temperature voltages of the respective layers of the structural bodies of which levels vary according to temperatures, the temperatures of the respective layers of the structural bodies may be precisely measured.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
    a first structural body including a first temperature voltage generation unit configured to generate a first temperature voltage and a second temperature voltage which have different voltage level variations according to a temperature variation, in response to a temperature measurement command, and a first temperature information determination unit configured to generate first temperature information depending on a difference between levels of the first and second temperature voltages; and
    a second structural body including a second temperature voltage generation unit configured to generate a third temperature voltage and a fourth temperature voltage which have different voltage level variations according to a temperature variation, when a predetermined time elapses after the first and second temperature voltages are generated from the first structural body, and a second temperature information determination unit configured to generate second temperature information depending on a difference between levels of the third and fourth temperature voltages,
    wherein the first temperature voltage generation unit generates a preliminary output control pulse when the temperature measurement command is inputted, and transfers an output control pulse which is acquired by synchronizing the preliminary output control pulse with a clock, to the second structural body through a through via.

2. The semiconductor apparatus according to claim 1, wherein each of the first and second structural bodies comprises an integrated circuit, and the first and second structural bodies are electrically connected with each other by a through via.

3. The semiconductor apparatus according to claim 2, wherein the first temperature voltage generation unit generates the output control pulse in response to the temperature measurement command, and outputs the first and second temperature voltages during an activation period of the output control pulse.

4. The semiconductor apparatus according to claim 3, wherein the first temperature voltage generation unit comprises:
    a preliminary temperature voltage generating section configured to generate a first preliminary temperature voltage and a second preliminary temperature voltage which have different voltage level variations according to a temperature variation;
    a pulse generating section configured to generate the preliminary output control pulse in response to the temperature measurement command;
    a clock synchronizing section configured to output the preliminary output control pulse as the output control pulse in synchronization with the clock; and
    a voltage output section configured to output the first and second preliminary temperature voltages as the first and second temperature voltages during the activation period of the output control pulse.

5. The semiconductor apparatus according to claim 1, wherein the first temperature information determination unit comprises:
    an amplifying section configured to amplify the levels of the first and second temperature voltages and generate a first amplified voltage and a second amplified voltage; and
    a temperature information output section configured to generate the first temperature information in response to the first and second amplified voltages.

6. The semiconductor apparatus according to claim 5, wherein the first temperature information comprises a first temperature information signal and a second temperature information signal, and
    wherein the temperature information output section comprises:
    a first current source part configured to supply a constant amount of current to a first output node;
    a first current sink part configured to control an amount of current flowing from the first output node to a ground terminal depending on a level of the first amplified voltage;
    a first signal output part configured to determine a level of the first temperature information signal depending on a voltage level of the first output node;
    a second current source part configured to supply the constant amount of current to a second output node;
    a second current sink part configured to control an amount of current flowing from the second output node to the ground terminal depending on a level of the second amplified voltage; and
    a second signal output part configured to determine a level of the second temperature information signal depending on a voltage level of the second output node.

7. The semiconductor apparatus according to claim 1, wherein the second temperature voltage generation unit comprises:

a preliminary temperature voltage generating section configured to generate a first preliminary temperature voltage and a second preliminary temperature voltage which have different voltage level variations according to a temperature variation;

a clock synchronizing section configured to generate a delayed output control pulse by synchronizing the output control pulse transferred through the through via, with the clock; and a voltage output section configured to output the first and second preliminary temperature voltages as the third and fourth temperature voltages during an activation period of the delayed output control pulse.

8. The semiconductor apparatus according to claim 1, wherein the first structural body is a master chip and the second structural body is a slave chip.

9. A semiconductor apparatus comprising:

a first temperature voltage generation unit configured to generate a preliminary output control pulse in response to a temperature measurement command, output the preliminary output control pulse as an output control pulse in synchronization with a clock, and output a first temperature voltage and a second temperature voltage which have different voltage level variations according to a temperature variation, in response to the output control pulse;

a first temperature information determination unit configured to generate first temperature information according to a difference between levels of the first and second temperature voltages;

a second temperature voltage generation unit configured to output a third temperature voltage and a fourth temperature voltage which have different voltage level variations according to a temperature variation, in response to a delayed output control pulse which is generated by synchronizing the output control pulse with the clock; and a second temperature information determination unit configured to generate second temperature information according to a difference between levels of the third and fourth temperature voltages.

10. The semiconductor apparatus according to claim 9, wherein the first temperature voltage generation unit comprises:

a preliminary temperature voltage generating section configured to generate a first preliminary temperature voltage and a second preliminary temperature voltage which have different voltage level variations according to a temperature variation;

a pulse generating section configured to generate the preliminary output control pulse in response to the temperature measurement command;

a clock synchronizing section configured to output the preliminary output control pulse as the output control pulse in synchronization with the clock; and a voltage output section configured to output the first and second preliminary temperature voltages as the first and second temperature voltages during the activation period of the output control pulse.

11. The semiconductor apparatus according to claim 9, wherein the second temperature voltage generation unit comprises:

a preliminary temperature voltage generating section configured to generate a third preliminary temperature voltage and a fourth preliminary temperature voltage which have different voltage level variations according to a temperature variation;

a clock synchronizing section configured to output the delayed output control pulse by synchronizing the output control pulse with the clock; and a voltage output section configured to output the third and fourth preliminary temperature voltages as the third and fourth temperature voltages during an activation period of the delayed output control pulse.

12. The semiconductor apparatus according to claim 9, wherein the first temperature information determination unit amplifies a difference between levels of the first and second temperature voltages, and generates the first temperature information which has a code value according to an amplified voltage level difference.

13. The semiconductor apparatus according to claim 9, wherein the second temperature information determination unit amplifies a difference between levels of the third and fourth temperature voltages, and generates the second temperature information which has a code value according to an amplified voltage level difference.

* * * * *